(12) United States Patent
Dardona et al.

(10) Patent No.: US 10,815,902 B2
(45) Date of Patent: Oct. 27, 2020

(54) FAULT DETECTION ASSEMBLY

(71) Applicant: United Technologies Corporation, Farmington, CT (US)

(72) Inventors: Sameh Dardona, South Windsor, CT (US); Cagatay Tokgoz, Beaumont, TX (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 265 days.

(21) Appl. No.: 15/844,735

(22) Filed: Dec. 18, 2017

(65) Prior Publication Data

US 2019/0186380 A1 Jun. 20, 2019

(51) Int. Cl.
| | |
|---|---|
| *F02C 9/00* | (2006.01) |
| *G05B 23/02* | (2006.01) |
| *G01R 31/69* | (2020.01) |
| *F02C 3/04* | (2006.01) |
| *G01R 31/00* | (2006.01) |

(52) U.S. Cl.
CPC ............... *F02C 9/00* (2013.01); *G01R 31/69* (2020.01); *G05B 23/02* (2013.01); *F02C 3/04* (2013.01); *F05D 2220/323* (2013.01); *F05D 2260/80* (2013.01); *F05D 2270/09* (2013.01); *G01R 31/008* (2013.01)

(58) Field of Classification Search
CPC .... F05D 2270/09; F05D 2260/80; F02K 3/06; F02C 9/00; H01R 2201/00–26; G01R 31/008; G01R 31/02; G01R 31/04; G01R 31/041; G01R 31/042; G01R 31/043; G01R 31/045; G01R 31/05; G01R 31/11

USPC ....... 324/500–527; 220/200–380; 439/1–894
See application file for complete search history.

(56) References Cited

U.S. PATENT DOCUMENTS

| | | | |
|---|---|---|---|
| 3,667,034 A | 5/1972 | Freeze | |
| 4,249,238 A * | 2/1981 | Spang, III | ................. F02C 9/28 60/39.24 |
| 4,338,504 A | 7/1982 | Gray | |
| 6,114,871 A | 9/2000 | Shiota et al. | |

(Continued)

OTHER PUBLICATIONS

Paul Smith, Cynthia Furse and Jacob Gunther, "Analysis of Spread Spectrum Time Domain Reflectometry for Wire Fault Location," IEEE Sensors Journal, vol. 5, No. 6, Dec. 2005, pp. 1469-1478. (Year: 2005).*

(Continued)

*Primary Examiner* — Todd E Manahan
*Assistant Examiner* — David P. Olynick
(74) *Attorney, Agent, or Firm* — Carlson, Gaskey & Olds, P.C.

(57) ABSTRACT

A fault detection assembly for an aircraft system according to an example of the present disclosure includes, among other things, a transmitter that communicates an electrical input signal to a first portion of an electrical connector, the first portion moveable between a fully seated position and a fully unseated position relative to a second portion of the electrical connector to define a range of insertion depths, a receiver that senses an electrical output signal relating to the electrical input signal, and a comparison module that determines an insertion depth in the range of insertion depths based on a change in a resonant frequency of the electrical output signal with respect to the electrical input signal.

16 Claims, 6 Drawing Sheets

(56) References Cited

U.S. PATENT DOCUMENTS

| | | | |
|---|---|---|---|
| 6,142,059 A | 11/2000 | Chan et al. | |
| 6,483,319 B1 | 11/2002 | Kendig et al. | |
| 6,725,404 B1 | 4/2004 | Choudhury et al. | |
| 9,476,795 B1 | 10/2016 | Cogger et al. | |
| 2006/0181283 A1* | 8/2006 | Wajcer | G01R 31/11 324/539 |
| 2010/0110618 A1* | 5/2010 | Kim | G01R 31/08 361/679.01 |
| 2013/0271298 A1 | 10/2013 | Restrepo et al. | |
| 2014/0266238 A1* | 9/2014 | Furse | G01R 31/2841 324/533 |
| 2015/0212025 A1* | 7/2015 | Francis-Buller | G01R 31/11 324/693 |
| 2015/0349899 A1* | 12/2015 | Butler | G01R 35/005 375/227 |
| 2017/0010314 A1* | 1/2017 | Drost | G01R 31/11 |
| 2017/0175675 A1* | 6/2017 | Sabnis | F02K 1/52 |
| 2018/0284179 A1* | 10/2018 | Hashizume | G01R 31/046 |
| 2018/0292816 A1* | 10/2018 | Wu | G05B 23/0221 |
| 2019/0120889 A1* | 4/2019 | Carcia | G01R 31/026 |

OTHER PUBLICATIONS

Chirag R. Sharma, Cynthia Furse and Reid R. Harrison, "Low-Power STDR CMOS Sensor for Locating Faults in Aging Aircraft Wiring," IEEE Sensors Journal, vol. 7, No. 1, Jan. 2007, pp. 43-50. (Year: 2007).*

Eric Bogatin, "The quater-wave stub frequency: Rule of Thumb#17," Blog, Bogatin's Rules of Thumb, edn.com, Oct. 6, 2014 (Year: 2014).*

Extended European Search Report for European Patent Application No. 18213743.0 dated May 14, 2019.

Appendix 1. S-parameter Basics. Retrieved from: https://product.tdk.com/en/technicalsupport/seat/pdf/etutorial_007.pdf.

Tokgoz, C., Dardona, S., Soldner, N.C., and Wheeler, K.R. (2016). Modeling and characterization of partially inserted electrical connector faults. Journal of Applied Physics. 119. p. 104501.

\* cited by examiner

FAULT DETECTION ASSEMBLY

STATEMENT REGARDING FEDERALLY SPONSORED RESEARCH OR DEVELOPMENT

This invention was made with government support under Contract No. NNA12AB91C, awarded by the United States National Aeronautics and Space Administration (NASA). The Government has certain rights in this invention.

BACKGROUND

This application relates to fault detection for aerospace systems, including fault detection for electrical connectors.

Gas turbine engines typically include a fan delivering air into a low pressure compressor section. The air is compressed in the low pressure compressor section, and passed into a high pressure compressor section. From the high pressure compressor section the air is introduced into a combustor section where it is mixed with fuel and ignited. Products of this combustion pass downstream over a high pressure turbine section, and then a low pressure turbine section to extract energy for driving the fan.

Components of the engine may be coupled together by one or more electrical connectors. Detection of uncoupling of the electrical connectors can include manual inspection and time-domain reflectometry (TDR) based methodologies.

SUMMARY

A fault detection assembly for an aircraft system according to an example of the present disclosure includes a transmitter that communicates an electrical input signal to a first portion of an electrical connector. The first portion is moveable between a fully seated position and a fully unseated position relative to a second portion of the electrical connector to define a range of insertion depths. A receiver senses an electrical output signal relating to the electrical input signal. A comparison module determines an insertion depth in the range of insertion depths based on a change in a resonant frequency of the electrical output signal with respect to the electrical input signal.

In a further embodiment of any of the foregoing embodiments, the first portion is coupled to a first aircraft component and the second portion is coupled to a second aircraft component.

In a further embodiment of any of the foregoing embodiments, the receiver senses the electrical output signal in response to the transmitter communicating the electrical input signal during operation of the first and second aircraft components.

In a further embodiment of any of the foregoing embodiments, the first portion includes a first set of terminals and the second portion includes a second set of terminals that mate with respective terminals of the first set of terminals.

In a further embodiment of any of the foregoing embodiments, the transmitter and the receiver are coupled to each of the first set of terminals. The transmitter communicates an instance of the electrical input signal on each terminal of the first set of terminals, and the receiver senses an instance of the electrical output signal relating to the respective instance of the electrical input signal.

In a further embodiment of any of the foregoing embodiments, the comparison module compares the change in the resonant frequency to a predetermined set of insertion depths defined with respect to the fully seated position and the fully unseated position.

In a further embodiment of any of the foregoing embodiments, the insertion depth corresponds to a contact area defined with respect to a terminal of the first portion and a terminal of the second portion that mates with the terminal of the first portion to establish a conductive pathway.

In a further embodiment of any of the foregoing embodiments, the comparison module determines the insertion depth in response to the receiver sweeping a predetermined frequency range relating to the resonant frequency.

In a further embodiment of any of the foregoing embodiments, the electrical input signal is a pulse signal, and the comparison module determines the insertion depth in response to the receiver scanning for the pulse signal.

In a further embodiment of any of the foregoing embodiments, the comparison module generates an indicator in response to determining that the insertion depth is below a predetermined threshold.

In a further embodiment of any of the foregoing embodiments, the predetermined threshold corresponds to an intermediate position between the fully seated position and the fully unseated position.

A gas turbine engine assembly according to an example of the present disclosure includes a fan section that has a compressor section, a combustor section, a turbine section that drives the fan section and the compressor section, and an electrical connector that has a first portion coupled to a first component and a second portion coupled to a second component. The first portion is moveable between a fully seated position and a fully unseated position relative to the second portion. A fault detection assembly includes a transmitter communicates an electrical input signal to the electrical connector. A receiver senses an electrical output signal relating to the electrical input signal. A comparison module causes an engine controller to change between a first operating mode and a second operating mode in response to determining that an insertion depth of the first portion relative to the second portion is below a predetermined threshold. The insertion depth is based on a change in a resonant frequency of the electrical output signal with respect to the electrical input signal.

In a further embodiment of any of the foregoing embodiments, the predetermined threshold corresponds to an intermediate position between the fully seated position and the fully unseated position.

In a further embodiment of any of the foregoing embodiments, the comparison module compares the change in the resonant frequency to a predetermined set of insertion depths, the predetermined set of insertion depths defined with respect to the fully seated position and the fully unseated position.

In a further embodiment of any of the foregoing embodiments, the electrical connector is a cable connector. The first portion includes a first set of terminals, and the second portion includes a second set of terminals that mate with respective terminals of the first set of terminals.

A method of detecting a fault for an electrical connector according to an example of the present disclosure includes communicating an electrical input signal to a first portion of an electrical connector. The first portion is moveable between a fully seated position and a fully unseated position relative to a second portion of the electrical connector to define a range of insertion depths. The first portion is coupled to a first aircraft component, and the second portion coupled to a second aircraft component. The method includes sensing an electrical output signal relating to the electrical input signal, and determining an insertion depth in the range of insertion depths based on a change in a resonant frequency of the electrical output signal with respect to the electrical input signal.

In a further embodiment of any of the foregoing embodiments, the step of determining the insertion depth includes comparing the change in the resonant frequency to a predetermined set of insertion depths defined with respect to the fully seated position and the fully unseated position.

In a further embodiment of any of the foregoing embodiments, the step of communicating the electrical input signal includes communicating the electrical input signal during operation of a gas turbine engine in communication with at least one of the first and second aircraft components.

A further embodiment of any of the foregoing embodiments includes causing an engine controller to change between a first operating mode and a second operating mode in response to determining that the insertion depth is below a predetermined threshold. The predetermined threshold corresponds to an intermediate position between the fully seated position and the fully unseated position.

A further embodiment of any of the foregoing embodiments includes moving the first portion toward the fully inserted position in response to determining that the insertion depth is below a predetermined threshold. The predetermined threshold corresponds to an intermediate position between the fully seated position and the fully unseated position.

The various features and advantages of this disclosure will become apparent to those skilled in the art from the following detailed description. The drawings that accompany the detailed description can be briefly described as follows.

BRIEF DESCRIPTION OF THE DRAWINGS

Like reference numbers and designations in the various drawings indicate like elements.

DETAILED DESCRIPTION

Figure 1:
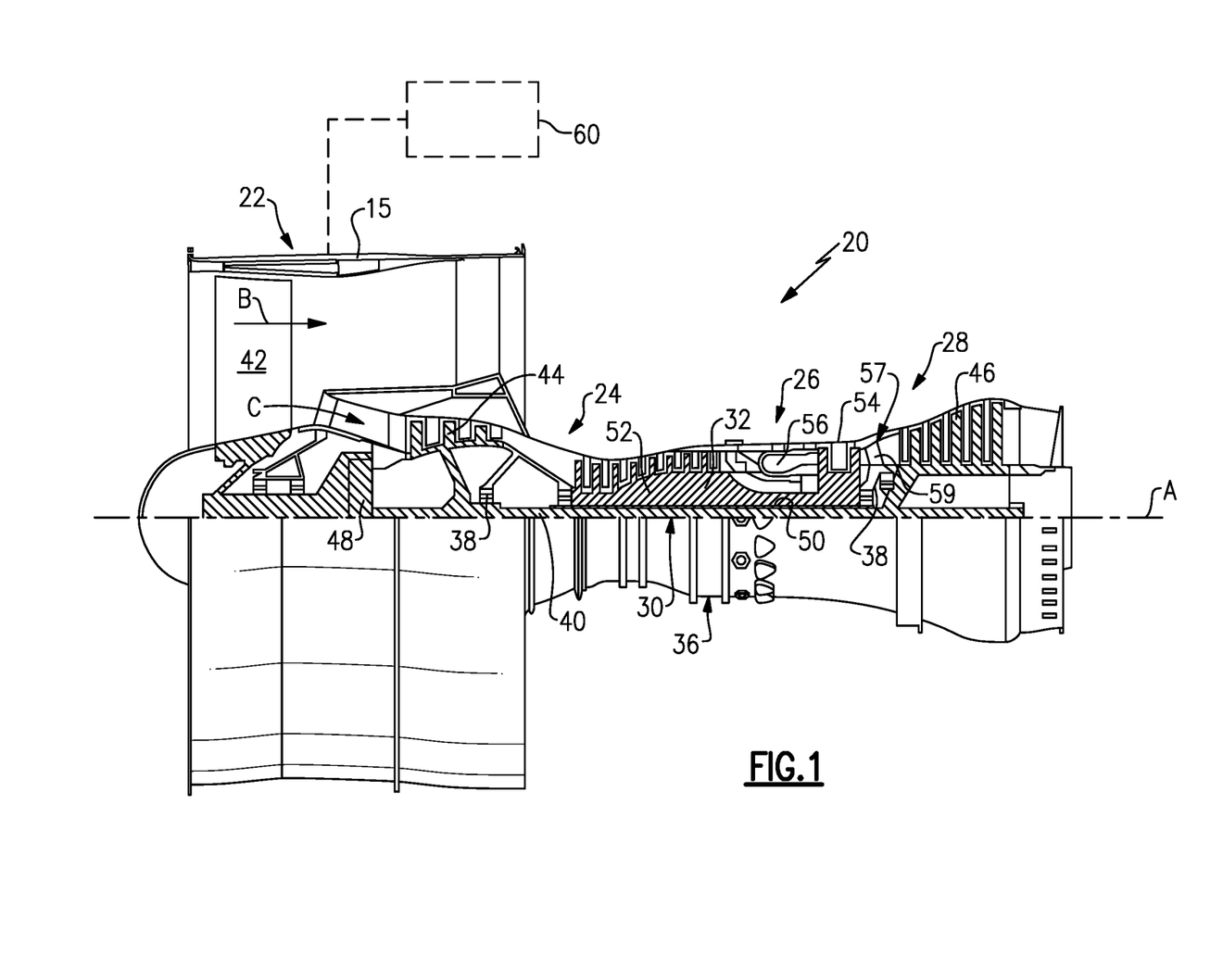
FIG. 1 illustrates a gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, and also drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10,668 meters). The flight condition of 0.8 Mach and 35,000 ft (10,668 meters), with the engine at its best fuel consumption—also known as "bucket cruise Thrust Specific Fuel Consumption ('TSFC')"—is the industry standard parameter of 1 bm of fuel being burned divided by 1 bf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(\text{Tram }°R)/(518.7° R)]^{0.5}$. The "Low corrected fan tip speed" as disclosed herein according to one non-limiting embodiment is less than about 1150 ft/second (350.5 meters/second).

The engine 20 can include or can otherwise communicate with an engine controller 60. In embodiments, the engine controller 60 is a full authority digital engine control (FADEC), an electronic engine control (EEC), or another subsystem of the engine 20 or aircraft system incorporating the engine 20. The controller 60 is programmed with logic to monitor and control one or more components of the engine 20. In this disclosure, like reference numerals designate like elements where appropriate and reference numerals with the addition of one-hundred or multiples thereof designate modified elements that are understood to incorporate the same features and benefits of the corresponding original elements.

Figure 2:
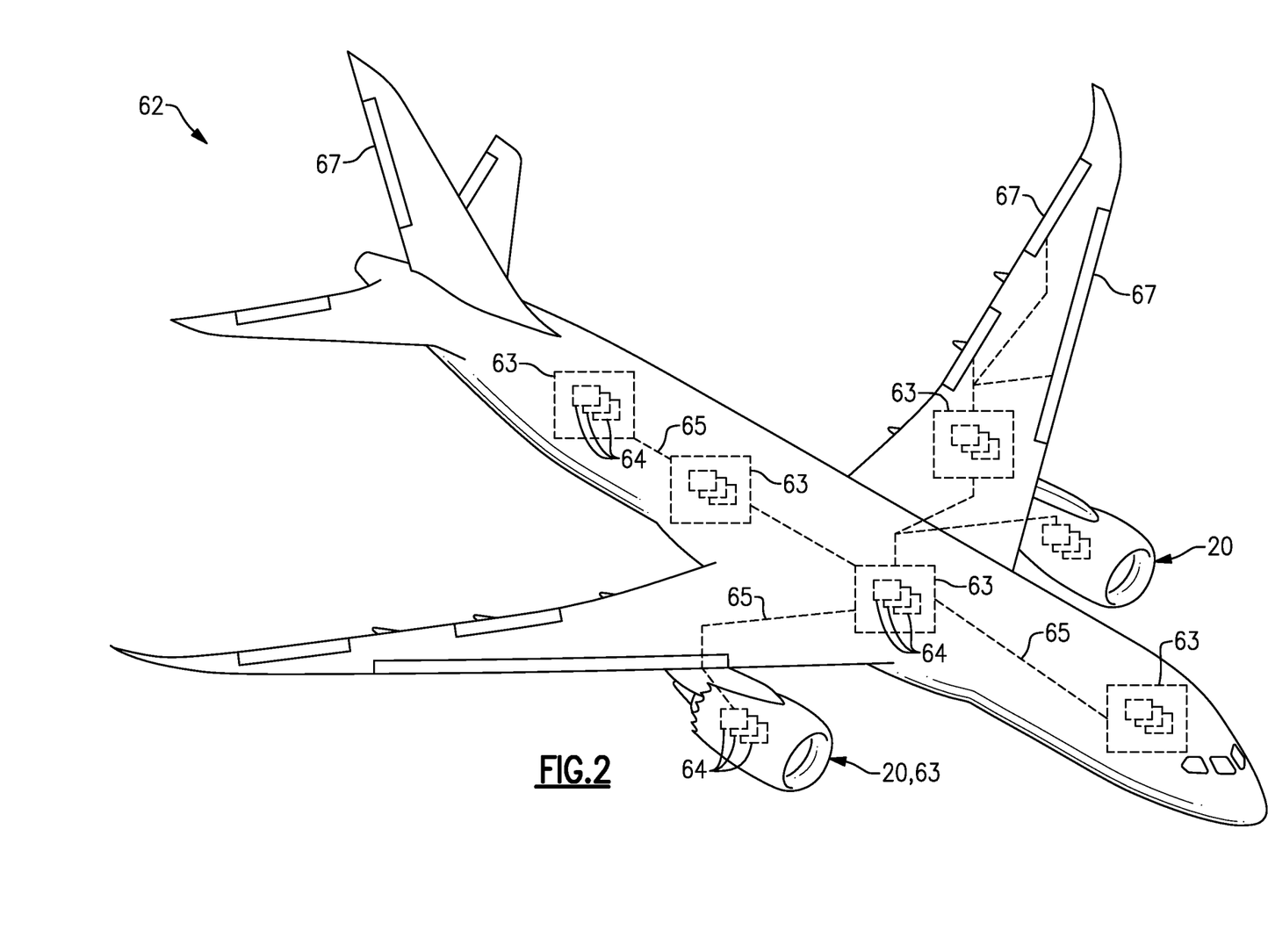
FIG. 2 illustrates an aircraft system.

FIG. 2 illustrates an aircraft system 62 according to an embodiment. The aircraft system 62 includes one or more subsystems 63 in communication with each other. The subsystems 63 can include one or more engines, such as the engine 20 of FIG. 1. Other example aircraft subsystems 63 can include engine environmental control systems (ECS), communications and navigation systems, auxiliary power systems, actuation systems that control or modulate one or more mechanical loads such as pivotable flaps 67 to maneuver the aircraft system 62, and other subsystems to control or provide various functionality of the aircraft system 62. Each of the subsystems 63 can include one or more aircraft components 64. The components 64 can interface or otherwise communicate with other components 64 and/or subsystems 63 via one or more communication paths 65. Each communication path 65 can carry control signal, data or current for powering one or more components 64, for example.

Figure 3:
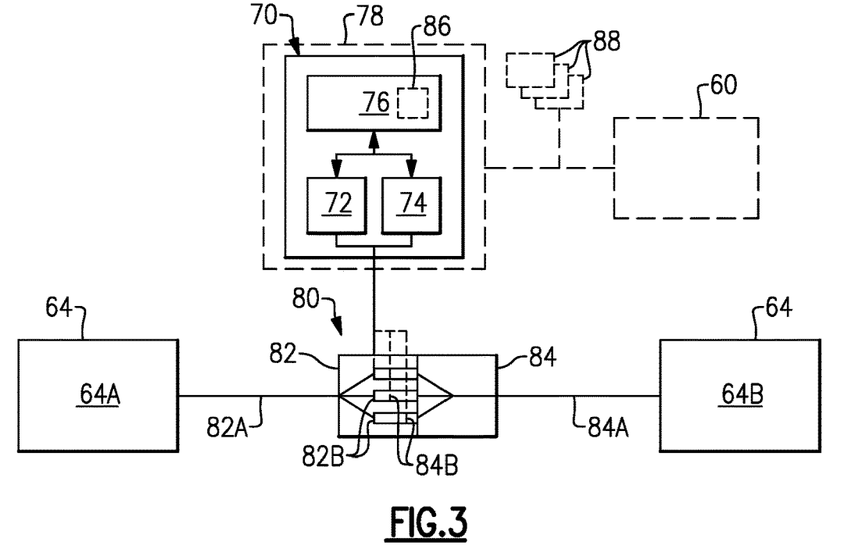
FIG. 3 illustrates a fault detection assembly coupled to an electrical connector according to an embodiment.

Referring to FIG. 3, an exemplary fault detection assembly 70 according to an embodiment is shown. The fault detection assembly 70 is operable to detect, identify, characterize or otherwise determine a precursor or early indicator to a fault in an electrical connector that interconnects two components, such as two aircraft components 64 of engine 20 or aircraft system 62. Although the electrical connectors discussed herein primarily refer to components of a gas turbine engine or aircraft system, other systems can benefit from the teachings herein, such as space systems and other aerospace systems, ground-based systems and marine-based systems.

The fault detection assembly 70 includes a transmitter 72, a receiver 74 and a comparison module 76. One or more aspects of the transmitter 72, receiver 74 and/or comparison module 76 can be incorporated in or otherwise executed by a control 78 (shown in dashed lines).

The transmitter 72 and receiver 74 are electrically coupled to an electrical connector 80 including a first portion 82 that mates with a second portion 84. In the illustrated example of FIG. 3, the electrical connector 80 is a cable connector or wire harness with lines or cables 82A, 84A interconnecting the respective first and second portions 82, 84 and respective first and second aircraft components 64A, 64B. In other embodiments, the first and second portions 82, 84 are different portions of a length of electrical line or cable.

The first portion 82 includes a first set of terminals 82B, and the second portion 84 includes a second set of terminals 84B that mate with or are otherwise selectively coupled to respective terminals of the first set of terminals 82B to define respective electrical pathways between the first and second aircraft components 64A, 64B. Each electrical pathway can carry power or an electrical signal, for example.

Figure 4A:
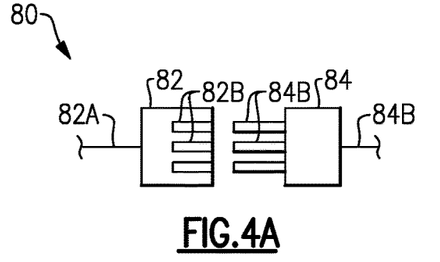
FIG. 4A illustrates the electrical connector of FIG. 3 in a fully unseated position.
Figure 4B:
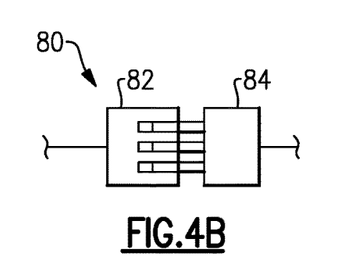
FIG. 4B illustrates the electrical connector of FIG. 3 in an intermediate position.

Each terminal 82B of the first portion 82 is selectively moveable or insertable between a fully seated, coupled or inserted position (FIG. 3) and a fully unseated, uncoupled or non-inserted position (FIG. 4A) relative to a respective terminal 84B of the second portion 84 to define a range of insertion depths. An example insertion depth includes an intermediate position between the fully seated position and the fully unseated position, as illustrated in FIG. 4B. The intermediate position can include a bare touch position in which a minimum amount of contact between the first and second portions 82, 84 is made sufficient to establish conductivity.

Figure 4C:
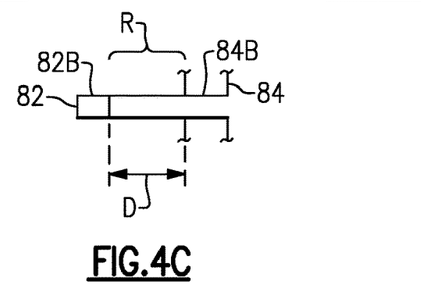
FIG. 4C illustrates a terminal of the electrical connector of FIG. 3.

FIG. 4C illustrates an example insertion depth D with respect to a pair of terminals 82B, 84B of the first and second portions 82, 84. The insertion depth D corresponds to a contact area R between the terminals 82B, 84B. The contact area R establishes a conductive pathway between the terminals 82B, 84B. A lesser insertion depth D generally corresponds to a decrease in conductivity or connectivity between the terminals 82B, 84B, and a relatively greater insertion depth D generally corresponds to an increase in conductivity or connectively. A reduction in insertion depth D may be caused by improper installation, or vibration or shock during operation, for example. The conductivity, connectivity, insertion depth D and contact area R can be reduced by frequency of usage, aging, oxidation or corrosion, for example.

As previously discussed, the fault detection assembly 70 is operable to detect or otherwise determine a precursor to, or an early indicator of, a fault in the electrical connector 80. A precursor to the fault can be estimated or inferred based on the insertion depth D of the first portion 82 relative to the second portion 84. For example, the fault can correspond to a terminal 82B of the first portion 82 being at least partially or fully unseated position from a respective terminal 84B of the second portion 84 such that the conductive pathway is opened, or a resistance impedes or interferes with signals from being communicated between the components 64A, 64B. Other faults can include a short in the electrical connector 80 and/or adjacent components coupled by the electrical connector 80.

The comparison module 76 is programmed with logic to determine or estimate the insertion depth D in the respective range of insertion depths based on comparing an expected value, and a measured change or shift in a resonant frequency of an electrical output signal with respect to an electrical input signal. Resonant frequencies are nulls within a measured S-parameter (scattering parameter) function, as known. The resonant frequencies are characterized by the circuitry coupled to the electrical connector 80, with the S-parameter values relating to a component or portion of an AC signal reflected back to the source (i.e., the transmitter 72) of the electrical input signal and transmission to other directions of the circuitry.

Each electrical input signal communicated to the respective terminal 82B/84B and each respective electrical output signal can be characterized by a respective S-parameter function. The number and location of the null values of the S-parameter function can depend on various characteristics of the electrical connector 80, including geometry and material of the electrical connector 80, and other circuitry coupled by the electrical connector 80 such as capacitors and inductors. For example, a crimped connection can define two null values. The shifts in resonant frequency and changes in magnitude can be based on the size of precursors of faults in the electrical connector 80, such as changes in the insertion depth D. Changes in the insertion depth D can be determined by measured S-parameters of respective terminal 82B/84B of the electrical connector 80. Measured S-parameters can also be obtained by measuring the transfer function between terminal 82B of the first portion 82 and terminal 84B of the second portion 84, and converting the transfer function to S-parameters. Analytical, simulation and physics-based models of the electrical connector 80 and adjacent circuitry can be developed to predict the shift in resonant frequencies and changes in magnitude, which can include S-parameters of the electrical connector 80 with respect to insertion depths D in the range of insertion depths.

The transmitter 72 and receiver 74 are electrically coupled to one or more (or each) of the terminals 82B of the first portion 82. The transmitter 72 is operable to communicate an electrical input signal to one or more of the terminals 82B, such as an alternating current (AC) signal swept at a predefined range of frequencies with predefined frequency increment and magnitude, or a pulsed signal covering a wide range of frequencies. The receiver 74 is operable to sense an electrical output signal relating to the electrical input signal at the same (or another) terminal 82B of the first portion 82, and/or at terminal 84B of the second portion 84. According to some embodiments, the transmitter 72 is operable to generate one or more electrical input signals within an ultra-wide-band (UWB) frequency range.

The receiver 74 senses the electrical output signal reflected back from terminal 82B of the first portion 82 and/or the electrical output signal transmitted from terminal 82B of the first portion 82 to terminal 84B of the second portion 84, and in response to the transmitter 72 communicating the electrical input signal during operation of the first and/or second aircraft components 64A, 64B. For example, the fault detection assembly 70 can be utilized to detect the insertion depth D of the respective first and second set of terminals 82B, 84B during operation of the engine 20 and/or aircraft system 62. In other embodiments, the fault detection assembly 70 detects the insertion depth D while the system or circuitry is at rest.

In embodiments, the transmitter 72 and receiver 74 are coupled to each of the first set of terminals 82B, and/or the second set of terminals 84B. In other embodiments, the transmitter 72 and receiver 74 are coupled to the cable 82A/84A a distance (e.g., a few millimeters to a few meters) from the respective terminal 82B/84B. The transmitter 72 communicates an instance of the electrical input signal on each terminal 82B/84B, and the receiver 74 senses an instance of the electrical output signal relating to the respective instance of the electrical input signal. For example, the transmitter 72 can sequentially communicate the instance of the electrical input signal on each terminal 82B/84B, and the receiver 74 can then sense the respective electrical output signal sequentially on each of the respective terminals 82B/84B. It should be appreciated that the receiver 74 can sense the electrical output signal on the same terminal 82B/84B or on another terminal 82B/84B.

The comparison module 76 is operable to compare the change in the resonant frequency and/or magnitude to a predetermined set of insertion depths 86. The predetermined set of insertion depths 86 can be stored as one or more lookup tables based on measurement and/or modeling data that associate changes in resonant frequency and/or magnitude with insertion depth D, which can be accessed by the comparison module 76 to estimate or otherwise determine the insertion depth D. The data stored as lookup tables can be updated or recalibrated periodically to capture changes in the response of the electrical connector 80 over time due to factors such as usage and aging. In embodiments, the comparison module 76 compares the change in the resonant frequency and/or magnitude at the null locations of the respective electrical output signals and respective S-parameter values.

The predetermined set of insertion depths 86 can be utilized or defined utilizing pre-calibration data, for example. The pre-calibration data can be developed by physically varying the insertion depth D of each of the terminals 82B/84B, for example. In other embodiments, the predetermined set of insertion depths 86 are defined with respect to one or more formulas or physics-based models that characterize the change in the resonant frequency and magnitude with respect to the fully seated position. The fully seated position may serve as a baseline.

Various techniques for communicating the electrical input signal and sensing the respective electrical output signal can be utilized. In an embodiment, the comparison module 76 determines the insertion depth D in response to the receiver 74 sweeping a predetermined frequency range relating to the resonant frequency of the electrical input signal at a fixed voltage. In another embodiment, the electrical input signal is a pulse signal communicated from the transmitter 72 to the first portion 82. The comparison module 76 determines the insertion depth D in response to the receiver 74 scanning for the swept frequency signal or pulse signal.

The comparison module 76 can monitor a status and health of the electrical connector 80 and coupled circuitry in real-time or when the system is at rest. The comparison module 76 can generate one or more indicators 88 in response to determining that the insertion depth D of at least one of the terminals 82B/84B is below a predetermined threshold. The predetermined threshold can correspond to an insertion depth D that is less than the fully seated position. For example, the predetermined threshold can correspond to an intermediate position, such as 50% insertion, 20% insertion or a bare touch position. Each terminal 82B/84B of the electrical connector 80 can include a common predetermined threshold, or a different predetermined threshold can be set for each respective terminal 82B/84B.

Each predetermined threshold can be defined with respect to an expected shift or change in resonant frequency and/or magnitude of the electrical output signal with respect to the electrical input signal, for example. One or more of the indicators 88 can be communicated to another subsystem of the engine 20 or aircraft system 62. The indicator(s) 88 can serve as a precursor or early indicator of fault prior to the first portion 82 becoming substantially unseated from the second portion 84 of the electrical connector 80, which can reduce system downtime and can increase system availability.

In embodiments, the comparison module 76 causes the engine controller 60 to change between a first operating mode and a second, different operating mode in response to determining that one or more of the insertion depths D is below the predetermined threshold. The change in operating modes can include a denial of one or more steps in system startup, a transition of tasking from a primary component or system to a redundant or backup component or system, or a change to a maintenance operating mode, for example.

Figure 5:
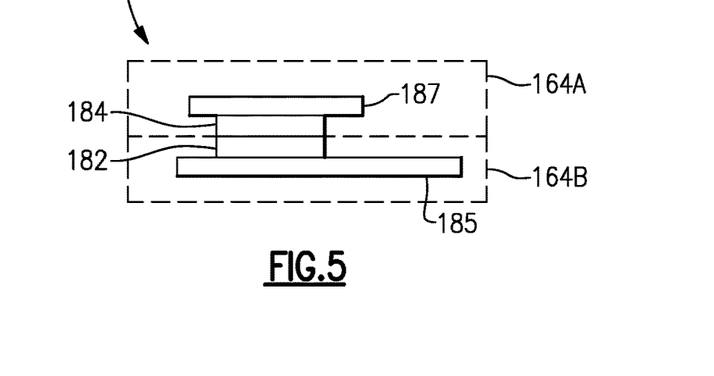
FIG. 5 illustrates an electrical connector according to another embodiment.

Although the electrical connector 80 is primarily discussed herein as a cable connector, the teachings herein can benefit other types of electrical connectors. In the illustrated example of FIG. 5, electrical connector 180 is a socket connection including first portion 182 that mates with second portion 184 to interconnect first and second aircraft components 164A, 164B. The first portion 182 is a socket that can be attached to circuitry such as a circuit board 185. The second portion 184 can include a set of pins or terminals, and can interface or be integrated with a circuit card 187 or cable, for example.

Figure 6:
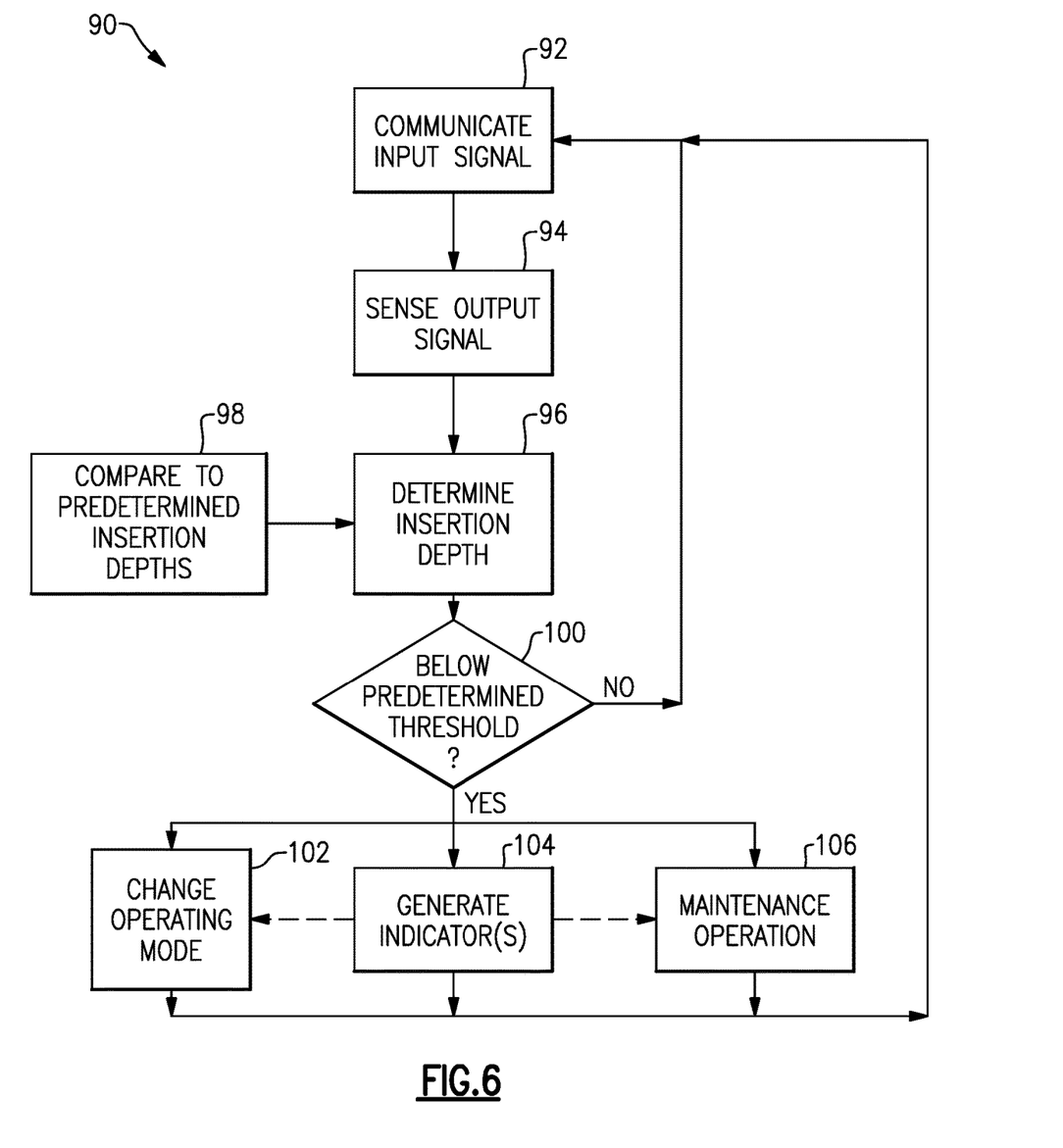
FIG. 6 illustrates a process for detecting a fault in an electrical connector according to an embodiment.

FIG. 6 illustrates a method of detecting a fault for an electrical connector illustrated in flowchart 90 according to an embodiment. The algorithm 90 can be utilized with the fault detection assembly 70 and connector 80 of FIG. 3, for example. At step 92, an electrical input signal is communicated to a terminal of a first portion of an electrical connector when the system or circuitry is operational or at rest. For example, the electrical input signal can be communicated during operation of a gas turbine engine and/or aircraft comprising first and second aircraft components coupled by the electrical connector.

At step 94, an electrical output signal is sensed on a terminal of the electrical connector relating to the electrical input signal. At step 96, a determination or estimation of an insertion depth in a range of insertion depths based on a change in a resonant frequency and/or magnitude of the electrical output signal with respect to the original electrical output signal is made. Step 96 can include comparing the change in the resonant frequency and/or magnitude to a predetermined set of insertion depths at step 98 defined with respect to a fully seated position and a fully unseated position of the respective terminal(s). Although the teachings herein primarily refer to changes in insertion depth D, the techniques herein alternately or additionally can relate to changes in connectivity, conductivity and/or contact area R due to corrosion or environmental effects such as heating, oxidation or moisture (FIG. 4C). The comparison can be made at one or more null locations of the respective S-parameter functions relating to the electrical input and output signals.

At step 100, the algorithm determines whether or not the insertion depth is below a predetermined threshold, including any of the thresholds and positions discussed herein. In embodiments, at step 102 the algorithm causes a control, such as an engine or aircraft control, to change between a first operating mode and a second, different operating mode in response to determining that the insertion depth is below the predetermined threshold, including any of the thresholds discussed herein. In embodiments, at step 104 one or more indicators are generated in response to determining that the insertion depth is below the predetermined threshold, including any of the thresholds discussed herein.

In embodiments, at step 106 the algorithm includes conducting a maintenance operation in response to the predetermined threshold being met. The maintenance operation can be initiated based on the generation of one or more of the indicators at step 104. For example, the maintenance operation can include moving the first portion or second portion of the electrical connector towards the fully inserted position in response to determining that the insertion depth is below the predetermined threshold. The change in operating mode at step 102 can also occur in response to the indicator(s) being generated at step 104. Steps 92 to 106 can be repeated for each terminal of the electrical connector. The maintenance operation may include the update or recalibration of the data stored as lookup tables.

Figure 7:
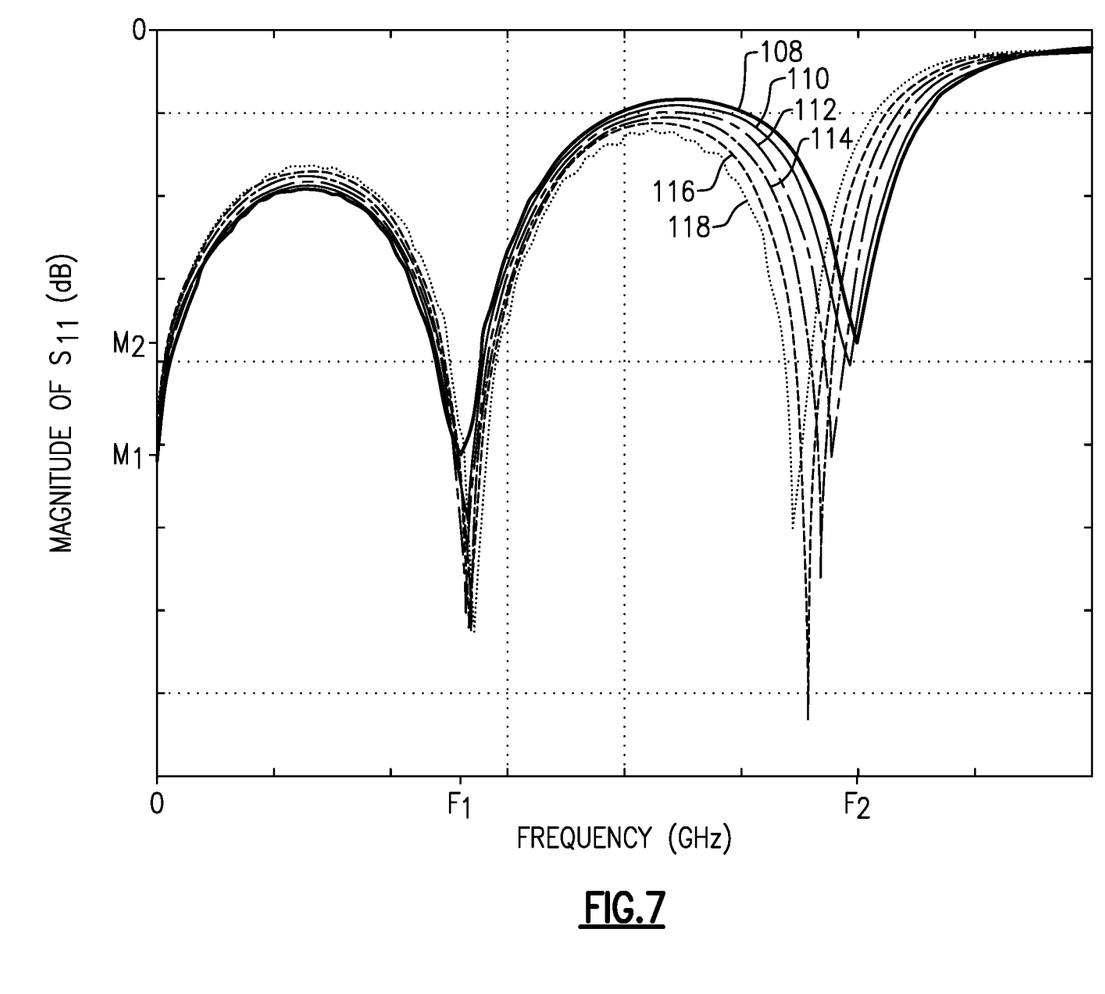
FIG. 7 illustrates a plot of signals for an electrical connector according to an embodiment.

FIG. 7 illustrates a plot of reflected signals relating to respective resonant frequencies of electrical input signals and insertion depths of a single terminal (or pair of input and output terminals) of an electrical connector, such as the electrical connector 80 (FIGS. 3 and 4A-4C), according to an embodiment. The plot depicts six exemplary S-parameters relating to actual insertion depths of the electrical connector, including curves 108, 110, 112, 114, 116 and 118. Each curve 108, 110, 112, 114, 116 and 118 can be characterized by a respective S-parameter function. In the illustrated example of FIG. 7, curve 108 corresponds to a fully or 100% inserted position. Curve 110 corresponds to an 80% inserted position, curve 112 corresponds to a 60% inserted position, curve 114 corresponds to a 40% inserted position, and curve 116 corresponds to a 20% inserted position. Curve 118 corresponds to a bare touch position. A predetermined threshold of the insertion depth can be one of the curves 110, 112, 116 and 118, for example, or another value that is less than the fully inserted position.

In the illustrated example of FIG. 7, curve 108 defines a null at the $F_1$ and $F_2$ frequencies with respective magnitudes of $M_1$ and $M_2$. The resonant frequencies can be in the order of about 300.0 to about 4.0 gigahertz (GHz), for example. The magnitude of the voltage of the respective curves 108, 110, 112, 114, 116 and 118 can be in the order of about 0.0 to about −45 decibels (dB), for example, or even lower than −45 dB based on receiver sensitivity. The curves 110, 112, 114, 116 and 118 include shifts in frequency and magnitude from the $F_1/M_1$ and $F_2/M_2$ values of curve 108 based on the respective insertion depths. As illustrated by FIG. 7, the shift in the null values of curves 110, 112, 114, 116 and 118 with respect to curve 108 indicates relatively good linearity or correlation with respect to changes in insertion depth and/or contact area.

Figure 8:
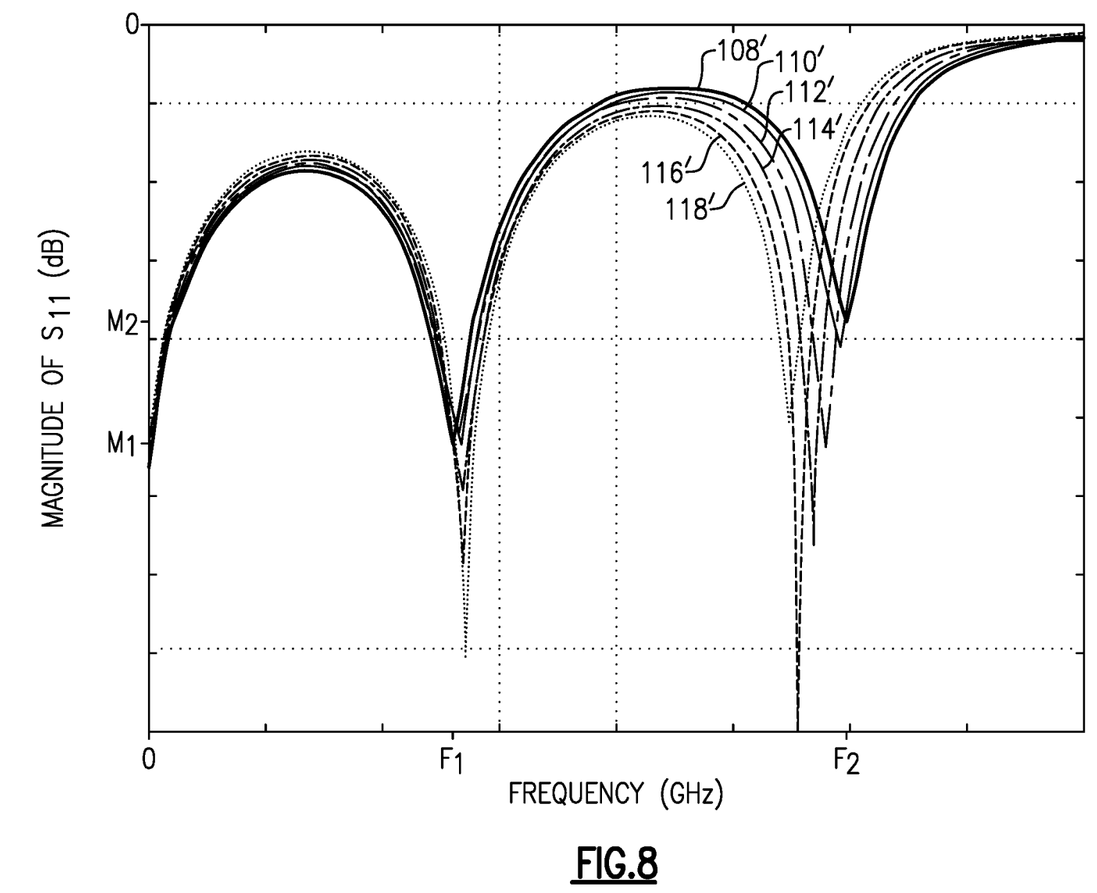
FIG. 8 illustrates a plot of signals for an electrical connector according to another embodiment.

FIG. 8 illustrates a plot of reflected signals relating to respective resonant frequencies of electrical input signals and insertion depths of a terminal (or pair of input and output terminals) of an electrical connector according to another embodiment. The plot depicts estimated values for six exemplary insertion depths of a terminal of the electrical connector, including curves 108', 110', 112', 114', 116' and 118'. The curves 108', 110', 112', 114', 116' and 118' can correspond to modeled values of the curves 108, 110, 112, 114, 116 and 118 of FIG. 7, for example, and can be developed from analytical, simulation and/or physics-based model(s) of the electrical connector and adjacent circuitry. The model(s) including curves 108', 110', 112', 114', 116' and 118' can closely approximate the shifts (including direction) in resonant frequency and/or magnitude with respect to changes in insertion depth and/or contact area. In some embodiments, the comparison module 76 (FIG. 3) calculates or estimates the actual insertion depth D based on defined curves relating to the expected changes in resonant frequencies with respect to changes in insertion depth D and/or contact area, which can each be expressed as a different curve or function.

The controller 60 and control 78 each typically include a processor, a memory and an interface. The processor may, for example only, be any type of known microprocessor having desired performance characteristics. The memory may, for example only, includes UVPROM, EEPROM, FLASH, RAM, ROM, DVD, CD, a hard drive, or other computer readable medium which may store data and the method of control of the controller 60 and control 78, and the algorithm 90 of this description. The interface facilitates communication with the other systems or components of the engine 20 and/or aircraft system 62, for example. In embodiments, the controller 60 and/or control 78 is a portion of a FADEC or an EEC, another system, or a stand-alone system.

It should be understood that relative positional terms such as "forward," "aft," "upper," "lower," "above," "below," and the like are with reference to the normal operational attitude of the vehicle and should not be considered otherwise limiting.

Although the different embodiments and examples have the specific components shown in the illustrations, embodiments of this disclosure are not limited to those particular combinations. It is possible to use some of the components or features from one of the embodiments or examples in combination with features or components from another one of the embodiments or examples.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A fault detection assembly for an aircraft system comprising:
    a transmitter that communicates an electrical input signal to a first portion of an electrical connector, the first portion moveable between a fully seated position and a fully unseated position relative to a second portion of the electrical connector to define a range of insertion depths;
    a receiver that senses an electrical output signal relating to the electrical input signal;
    a comparison module that determines a first S-parameter corresponding to a resonant frequency of the electrical output signal with respect to the electrical input signal, determines a shift in the resonant frequency by comparing the first S-parameter to a second S-parameter associated with a first insertion depth in the range of assertion depths, and determines an insertion depth associated with the first portion of the electrical connector based upon the determined shift in the resonant frequency; and
    wherein the first portion is coupled to a first aircraft component and the second portion is coupled to a second aircraft component, and the receiver senses the electrical output signal in response to the transmitter communicating the electrical input signal during operation of the first and second aircraft components.

2. The fault detection assembly as recited in claim 1, wherein the first portion includes a first set of terminals and the second portion includes a second set of terminals that mate with respective terminals of the first set of terminals.

3. The fault detection assembly as recited in claim 2, wherein the transmitter and the receiver are coupled to each of the first set of terminals, the transmitter communicates an instance of the electrical input signal on each terminal of the first set of terminals, and the receiver senses an instance of the electrical output signal relating to the respective instance of the electrical input signal.

4. The fault detection assembly as recited in claim 1, wherein the insertion depth corresponds to a contact area defined with respect to a terminal of the first portion and a terminal of the second portion that mates with the terminal of the first portion to establish a conductive pathway.

5. The fault detection assembly as recited in claim 1, wherein the comparison module determines the insertion depth in response to the receiver sweeping a predetermined frequency range relating to the resonant frequency.

6. The fault detection assembly as recited in claim 1, wherein the electrical input signal is a pulse signal, and the comparison module determines the insertion depth in response to the receiver scanning for the pulse signal.

7. The fault detection assembly as recited in claim 1, wherein the comparison module generates an indicator in response to determining that the insertion depth is below a predetermined threshold.

8. The fault detection assembly as recited in claim 7, wherein the predetermined threshold corresponds to an intermediate position between the fully seated position and the fully unseated position.

9. A gas turbine engine assembly comprising:
    a fan section including fan;
    a compressor section;
    a combustor section;
    a turbine section driving the fan section and the compressor section;
    an electrical connector including a first portion coupled to a first component and a second portion coupled to a second component, the first portion moveable between a fully seated position and a fully unseated position relative to the second portion to define a range of insertion depths; and
    a fault detection assembly comprising:
    a transmitter that communicates an electrical input signal to the electrical connector;
    a receiver that senses an electrical output signal relating to the electrical input signal; and
    a comparison module that determines a first S-parameter corresponding to a resonant frequency of the electrical output signal with respect to the electrical input signal, determines a shift in the resonant frequency by comparing the first S-parameter to a second S-parameter associated with a first insertion depth in the range of assertion depths, determines an insertion depth associated with the first portion of the electrical connector based upon the determined shift in the resonant frequency, and causes an engine controller to change between a first operating mode and a second operating mode in response to determining that the insertion depth of the first portion relative to the second portion is below a predetermined threshold.

10. The gas turbine engine assembly as recited in claim 9, wherein the predetermined threshold corresponds to an intermediate position between the fully seated position and the fully unseated position.

11. The gas turbine engine assembly as recited in claim 9, wherein the electrical connector is a cable connector, the first portion includes a first set of terminals, and the second portion includes a second set of terminals that mate with respective terminals of the first set of terminals.

12. A method of detecting a fault for an electrical connector comprising:

communicating an electrical input signal to a first portion of an electrical connector, the first portion moveable between a fully seated position and a fully unseated position relative to a second portion of the electrical connector to define a range of insertion depths, the first portion coupled to a first aircraft component, and the second portion coupled to a second aircraft component, wherein the step of communicating the electrical input signal includes communicating the electrical input signal during operation of a gas turbine engine in communication with at least one of the first and second aircraft components;

sensing an electrical output signal relating to the electrical input signal;

determining a first S-parameter corresponding to a resonant frequency of the electrical output signal with respect to the electrical input signal;

determining a shift in the resonant frequency by comparing the first S-parameter to a second S-parameter associated with a first insertion depth in the range of assertion depths; and determining an insertion depth associated with the first portion of the electrical connector based upon the determined shift in the resonant frequency.

13. The method as recited in claim 12, comprising causing an engine controller to change between a first operating mode and a second operating mode in response to determining that the insertion depth is below a predetermined threshold, the predetermined threshold corresponding to an intermediate position between the fully seated position and the fully unseated position.

14. The method as recited in claim 12, comprising moving the first portion toward the fully inserted position in response to determining that the insertion depth is below a predetermined threshold, the predetermined threshold corresponding to an intermediate position between the fully seated position and the fully unseated position.

15. The method as recited in claim 13, wherein the step of causing the engine controller to change between the first operating mode and the second operating mode includes a denial of one or more steps in system startup.

16. The method as recited in claim 13, wherein the step of causing the engine controller to change between the first operating mode and the second operating mode includes a transition of tasking from a primary component to a backup component.

* * * * *